(12) United States Patent
Zabka et al.

(10) Patent No.: US 7,040,487 B2
(45) Date of Patent: May 9, 2006

(54) PROTECTIVE SHIPPER

(75) Inventors: Michael Zabka, Eagan, MN (US);
James Nigg, Howard Lake, MN (US)

(73) Assignee: Entegris, Inc., Chaska, MN (US)

( * ) Notice: Subject to any disclaimer, the term of this patent is extended or adjusted under 35 U.S.C. 154(b) by 0 days.

(21) Appl. No.: 10/194,438

(22) Filed: Jul. 12, 2002

(65) Prior Publication Data
US 2003/0010657 A1    Jan. 16, 2003

Related U.S. Application Data (60) Provisional application No. 60/305,422, filed on Jul. 14, 2001.

(51) Int. Cl.
*B65D 85/48* (2006.01)
(52) U.S. Cl. .............. 206/710; 206/454; 220/326
(58) Field of Classification Search ............... 206/449, 206/454, 303, 710–712, 722, 1.5; 211/41.18; 220/324, 326, 4.21, 4.24, 315; 118/500
See application file for complete search history.

(56) References Cited

U.S. PATENT DOCUMENTS

| | | | |
|---|---|---|---|
| 3,552,548 A | 1/1971 | Wallestad et al. | |
| 3,850,296 A | 11/1974 | Hirata et al. | |
| 4,135,625 A | 1/1979 | Merrill | |
| 4,333,580 A | 6/1982 | Sweigart, Jr. | |
| 4,723,686 A | 2/1988 | Pennisi | |
| 4,817,799 A | 4/1989 | Gregerson et al. | |
| 4,886,162 A | 12/1989 | Ambrogio | |
| 5,211,717 A | 5/1993 | Skoura | |

(Continued)

FOREIGN PATENT DOCUMENTS

JP          9-92714        4/1997

*Primary Examiner*—Luan K. Bui
(74) *Attorney, Agent, or Firm*—Patterson, Thuente Skaar & Christensen, P.A.

(57) ABSTRACT

A protective shipper comprises a cover and a base that are held together by a latching member. The base is configurable to retain and protect semiconductor wafers or film frames with wafers within a storage pocket. The base comprises latching member and a support wall that defines a storage pocket. The cover encloses the storage pocket. One or both of the cover may receive recesses for gripability. The cover may receive one or more latching apertures configured to minimize unintended unlatching. The shipper of the present invention may be manufactured in a mold capable of producing film frame or wafer containing configurations of the shipper by using an interchangeable mold insert.

14 Claims, 8 Drawing Sheets

U.S. PATENT DOCUMENTS

| | | |
|---|---|---|
| 5,284,802 A | 2/1994 | Muraoka et al. |
| 5,366,079 A | 11/1994 | Lin et al. |
| 5,402,890 A | 4/1995 | Yajima et al. |
| 5,454,468 A | 10/1995 | Chou et al. |
| 5,474,177 A | 12/1995 | Abrams et al. |
| 5,553,711 A | 9/1996 | Lin et al. |
| 5,699,916 A | 12/1997 | Liang |
| 5,724,748 A | 3/1998 | Brooks et al. |
| 6,119,865 A | 9/2000 | Kawada |
| 6,193,068 B1 * | 2/2001 | Lewis et al. .................. 206/710 |
| 6,193,090 B1 | 2/2001 | Connors et al. |
| 6,198,068 B1 | 3/2001 | Lindstrom |
| 6,234,316 B1 | 5/2001 | Hsieh et al. |
| 6,237,771 B1 * | 5/2001 | Haq ............................ 206/710 |
| 6,286,684 B1 * | 9/2001 | Brooks et al. ............... 206/710 |
| 6,341,695 B1 | 1/2002 | Lewis et al. |
| 6,398,022 B1 * | 6/2002 | Mou et al. ................. 206/308.1 |
| 6,550,619 B1 * | 4/2003 | Bores et al. .................. 206/710 |

* cited by examiner

PROTECTIVE SHIPPER

REFERENCES TO RELATED APPLICATIONS

This application is based upon U.S. Provisional Application Serial No. 60/305,422, which is hereby incorporated by reference herein.

FIELD OF THE INVENTION

This invention relates to carriers for semiconductor wafers and film frames, and more particularly relates to shippers for same.

BACKGROUND OF THE INVENTION

Integrated circuits are manufactured from semiconductor wafers that are conventionally round in shape and made of highly brittle silicon. Such wafers are subjected to a variety of processing steps in transforming the semiconductor wafer into integrated circuit components. The various processing steps must be performed under ultra-clean conditions to minimize the potential of contamination of the wafers as they are being processed. Each wafer may be subjected to dozens, if not hundreds of steps in its processing cycle. The potential for contamination and destruction of a wafer or reduction in yield is ever-present throughout the various processing and packaging steps. Particularly during the steps that take place at fabrication facilities, any minute particulates can destroy the integrated circuit on which it falls. Once the processing steps of the wafers are completed, they are generally shipped while still in wafer form to a facility that will dice and encapsulate, in integrated circuit packaging, each individual circuit on the wafer.

The stringent particulate control that takes place during the processing steps is generally not necessary in shipping the completed wafers to the facility that dices and packages the individual circuits.

Traditionally, during the processing, storage and shipping of semiconductor wafers, the wafers are supported and constrained at their edges to prevent any contact, possible damage and contamination to the faces of the wafers having the circuits thereon.

Even as semiconductor wafers are getting larger in scale, now up to 300 millimeters in diameter, the density of components is getting significantly greater. Moreover, disks are also are getting thinner, providing much thinner completed integrated circuit packages. This has been driven, at least in part, by the cellular phone industry that has sought thinner cell phones.

Accompanying the trend towards larger, more dense and thinner wafers, the wafers are becoming more valuable, more brittle and more easily damaged during shipment. Although it is possible, desirable, and common to ship thicker wafers in enclosed containers that would support the wafers exclusively by their edges, using such devices to ship the thinner wafers has proven problematic due to breakage and damage of the wafers.

Thus, for the thinner more fragile wafers, enclosures are utilized which have the wafers axially stacked on top of one another and separated by layers of paper-like flexible sheet material. Thus, the support of each wafer is by adjacent wafers and the entire stack of wafers. Foam material, such as urethane, is used to cushion the top and bottom of the stack.

Such shippers can also be configured to receive film frames. The film frames are packaged similar to the wafers and protected during transport.

One type of prior art wafer carrier is disclosed in U.S. Pat. No. 5,553,711 to Lin. Lin discloses a container that has a base, upright sidewalls defining a circular pocket, wafer dividers and a cover that comes down and threadingly attaches to the base.

Figure 1:
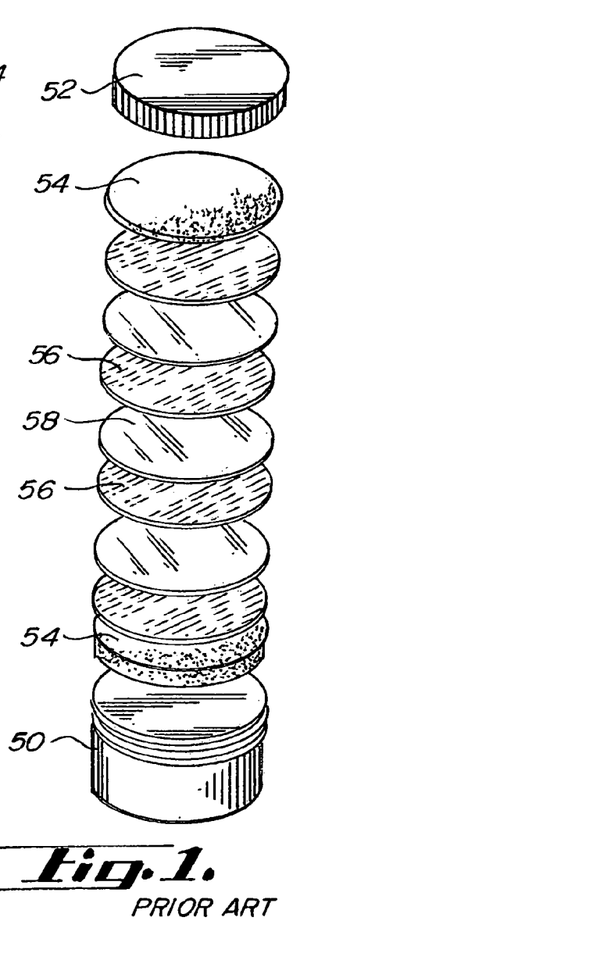
FIG. 1 is a perspective view of a prior art wafer carrier for carrying a stack of wafers.

FIG. 1 discloses a conventional wafer carrier in which the enclosure is defined by a cookie tin-like plastic container having a bottom 50, a top lid 52, and utilizing a circular urethane foam bottom cushion 54, and sheet material 56 interspersed between the wafer 58.

Figure 2:
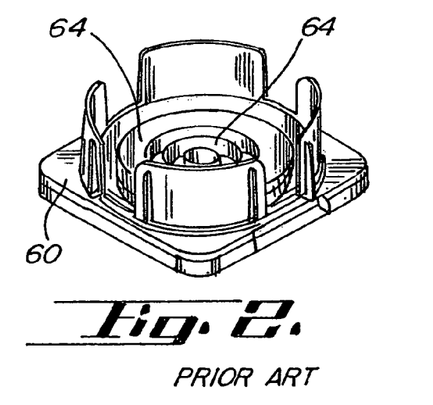
FIG. 2 is a perspective view of a base of a prior art wafer carrier.
Figure 3:
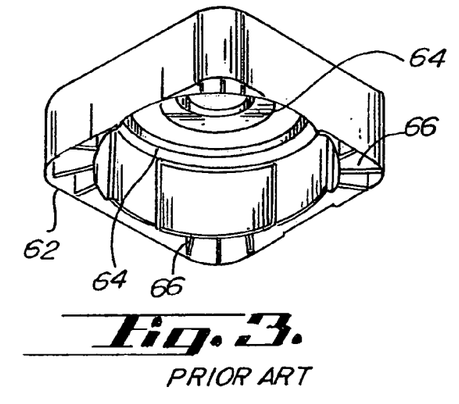
FIG. 3 is a perspective view of a top cover of a prior art wafer carrier.

Referring to FIGS. 2 and 3, another wafer shipper is disclosed for shipping the stacked wafers with dividers therebetween. This wafer shipper has a base 60 and a top cover 62. The base and top cover are injection molded and have circular shaped and axially-extending structural members 64 in the base component. Similarly, the top cover has axially-extending circular structural members 64 and radially extending ribs 66 that also project axially.

These stacking wafer shippers may be either manually handled, robotically handled or both. Thus, means for opening and closing such containers must be both manually and robotically operable, and for manual purposes should be intuitive as well as simple, and reliable and quick. Various means are known for latching such wafer shippers. These include threads, such as shown in prior art FIG. 1, or a snap-on seal as shown in prior art FIGS. 2–3. Other means for latching are a minimal rotation thread as shown in the embodiment of prior art FIG. 4, and axially-projecting spring latches as discussed hereinbelow.

Wafer shippers that use the threaded engagements are awkward and subject to misalignment and improper attachment. These wafer shippers visually appear symmetrical in at least two planes, and therefore, there are typically four different options in assembling a top cover to a bottom cover. However, conventional prior art shippers generally require that the top cover be assembled in a specific orientation for proper latching.

U.S. Pat. No. 6,193,068 to Lewis, et al., discloses another type of conventional shipper featuring axially-extending spring latches and utilizing a double wall to define the pocket for the stack of wafer carriers. Said double wall thickness is defined by two spaced thin wall sections which are not attached to one another extending from the base. This configuration appears to allow the individual unsupported thin walls supported only at the base to take on and retain deformation. The concentric arrangement of the thin walls makes any such deformation visibly apparent. The double sidewall in this prior art embodiment may help to isolate direct impact on the top cover from direct communication from top cover structure to the wall defining the wafer pocket.

Figure 4:
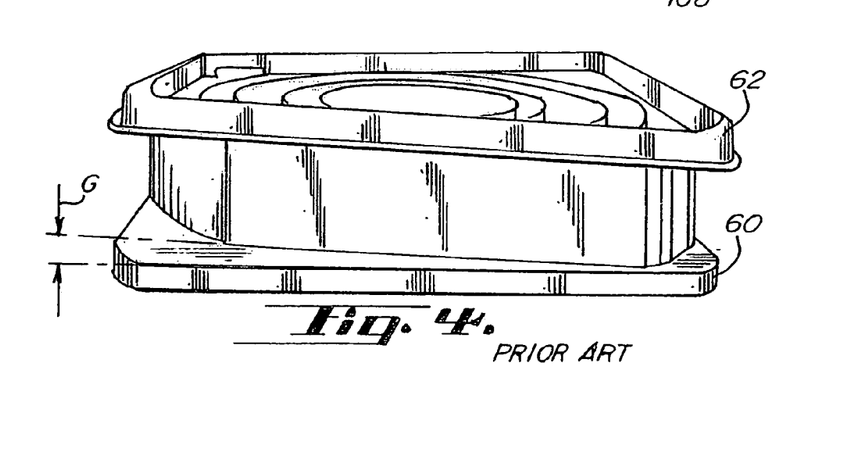
FIG. 4 is a perspective view of a prior art wafer carrier illustrating bowing stability issues.

In the minimal rotation latch embodiment shown in FIG. 4, any separation stress will occur as illustrated by gap G. Such loading of the wafer shipper also can cause the deformation of the otherwise planar corners of the base to be stressed out of position, causing wobbling when placed on a planar surface and error in seating when placed on a machine interface. Such deformation can be caused in part by an overloading condition and also in part by the structural configuration of the wafer shipper.

It would be desirable to provide sufficient structure in the base of such wafer shipper to prevent such distortion and bowing. Moreover, it would be highly desirable to provide a wafer carrier that has indicating means therein to prevent such an overloaded condition.

Other minimal rotation latched shippers may use stunted threads that allow the wafer carrier to be rotated less than 30° to accomplish the latching. Such wafer carrier has the difficultly of requiring relatively precise angular positioning for initial placement of the top cover on the base before said rotation.

Other embodiments may use axially-projecting double thin walls. Such embodiments provide double sidewalls are connected at the ends of each segment. Thus, four separate wall portions are defined, all of which are distinct from one another and integral with the base. Due to the connecting portions, which connect each of the pairs of thin sidewall segments, a direct impact blow on the top cover will transmit the force of such blow directly from the top cover through said connecting portions to the wafers. This top cover also has features configured as nubs, which may engage a floppy disk.

Generally, all embodiments of the wafer carriers herein will be injection molded of thermoplastic material such as polypropylene. Such material requires structure such as ribs and channels for rigidity.

In that these shippers do not have the severe particulate control issues that are necessary for carriers in the fab processing environment, it is not necessary to have hermetic sealing. In fact, such hermetic sealing is inimical to robotic handling and easy manual handling, specifically the opening and closing of the shippers. Still, it is important to have the interface between the top cover and the base to provide the best sealing characteristics possible. Moreover, it is important to eliminate or reduce any bowing that occurs along one of the sidewalls intermediate the corners of the top cover or the base.

These types of containers may be utilized once and thrown away, or may be recycled and utilized multiple times. Although the product shipped in such containers can be of immense value, it is still important to reduce the manufacturing cost of the shippers to as great as extent as possible, consistent with the other necessary characteristics.

A most important characteristic of such wafer shippers for stackable wafers is that the shippers provide protection from damage due to shock during the transportation. This shock may consist of direct impact with the shipper's top cover or base, or consist of jarring of the entire shipper package. In either case, it is important to provide protection from damage to the wafers packed therein.

Moreover, it is important that such wafer shippers provide latching means of high integrity that do not inadvertently open during shipment or handling; for example, when a shipper is inadvertently dropped.

Such shippers are typically drop tested to determine the overall integrity of the shipper. Upon such dropping, unlatching, breakage of the shipper or damage to the wafers constitutes a failure. The impact during dropping, including drop testing, creates shear, compressive and torsional forces on the shipper components. The shipper, including the latches, must withstand combinations of these forces when loaded.

These shippers rely heavily upon the separation of materials between wafers or frames, which may be polyethylene sheet material with carbon providing a static dissipative characteristic, polyurethane foam, or other suitable, flexible thin sheet material. Typically, the packing material placed on the bottom and top of the stack will be the polyurethane foam that is compressible. The compressibility of the foam facilitates packing a variable number of wafers in a particular shipper, which can leave some undesirable discretion to the packer as to how many wafers and/or how much padding material is appropriate for a particular shipper. Moreover, inserting excessive, or even a full load, of wafers and foam padding can, in prior art wafer shippers, particularly those with latches on the diagonal corners, cause distortion and/or bowing of the top cover and/or base. This bowing may actually cause a gap between the top cover and base. Such a gap is visually undesirable, may provide a pathway to contamination of the contents, and may further affect the integrity of the container during impact or shock, causing breakage or unlatching.

If the shipper is underpacked with foam or other packing material, breakage may occur at limits under normal impact limits. Known prior art wafer carriers have provided no ready assistance in identifying an appropriate range of foam and wafer stacked thickness, which is optimal for providing security to the wafers. Similarly, the stacked wafer shippers with the latches on the diagonally opposite corners have provided no means to minimize the visibility of the gap at the sides of the shipper when the shipper is fully loaded or slightly overloaded. Moreover, these prior art shippers have inadequately provided structural means to the base and top cover to provide rigidity and minimize said bowing and gaps at the interface.

SUMMARY OF THE INVENTION

A protective shipper comprises a cover and a base that are held together by a latching member. The base is configurable to retain and protect semiconductor wafers or film frames with wafers within a storage pocket. The base comprises a latching member and a support wall that defines a storage pocket. The cover encloses the storage pocket. One or both of the cover may receive recesses for gripability. The cover may receive one or more latching apertures having a first engagement width and a second engagement width, the first engagement width being larger than the second engagement width. The shipper of the present invention may be manufactured in a mold capable of producing film frame, wafer containing or combination configurations of the shipper by using an interchangeable mold insert.

A feature and advantage of particular embodiments of the invention is to improve the handling and stacking of shippers by providing recessed portions therein.

A further feature and advantage of particular embodiments of the invention is that the shipper is less likely to release when shock is introduced because the latches require a horizontal component of movement within the substantially T-shaped aperture to release.

A further feature and advantage of particular embodiments of the invention is that the shipper can be configured to retain film frames, semiconductor wafers or a combination thereof.

A further feature and advantage of particular embodiments of the invention is that the shipper can be produced according to film frame, wafer stack or combination configurations on the same machinery.

A further feature and advantage of particular embodiments of the present invention is to overcome disadvantages present in the prior art.

Further features and advantages of particular embodiments of the invention will become apparent to those skilled in the art through the descriptions, claims and the figures herein.

DETAILED DESCRIPTION OF PREFERRED EMBODIMENTS

Copending U.S. application Ser. No. 09/851,499, filed on May 8, 2001, hereby incorporated by reference, discloses a shock resistant variable load tolerant wafer shipper. Such wafer shipper uses axially projecting spring latches to secure said shipper in the closed position.

Figure 5:
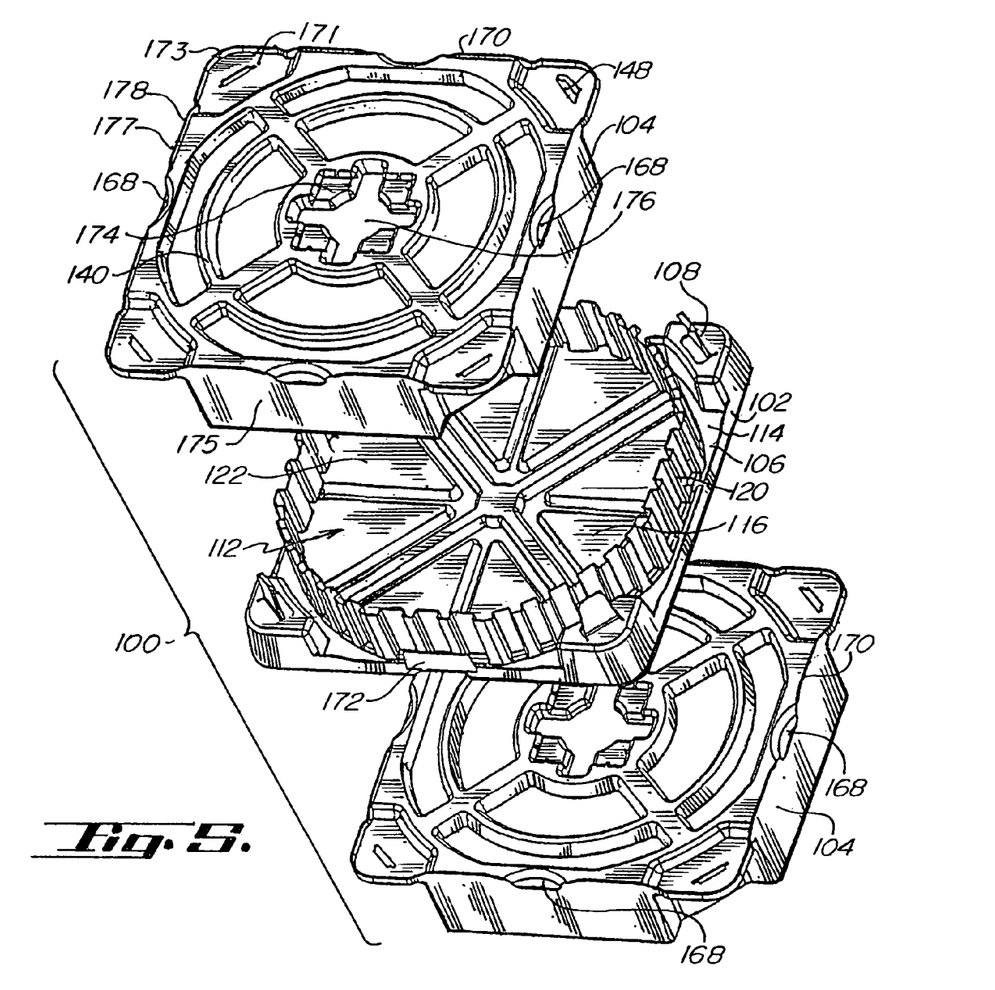
FIG. 5 is a perspective view of the portions of two shippers in stacking alignment according to an embodiment of the present invention.
Figure 6:
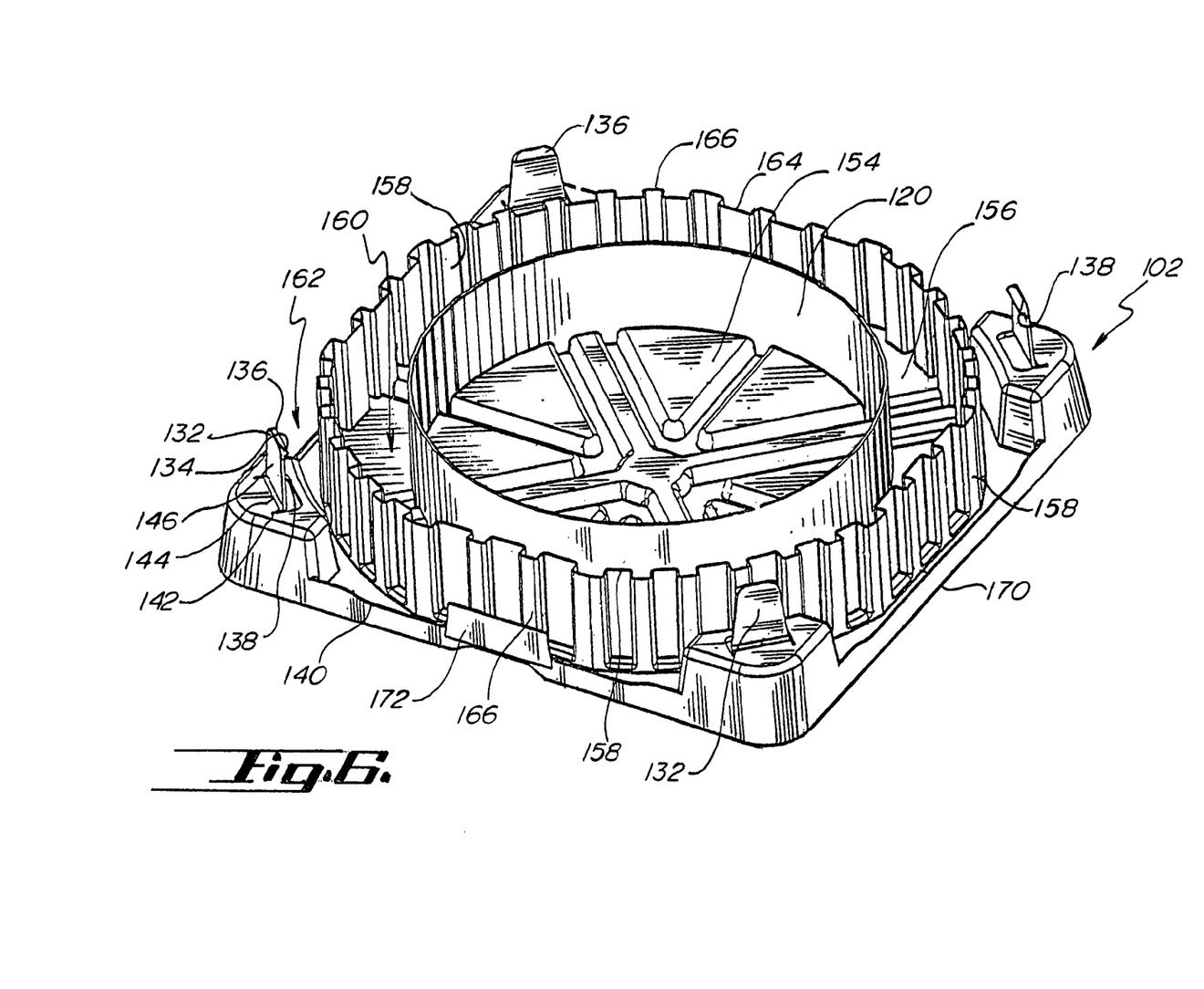
FIG. 6 is a perspective view of the base of a wafer shipper according to an embodiment of the present invention.

Referring to FIGS. 5–6, a shipper for protecting semiconductor wafers or film frames according to embodiments of the present invention is shown. The shipper 100 generally comprises two cooperating portions, configured as a base 102 and a top cover 104. The top cover 104 and base 102 meet at an interface 106 and are secured by latch mechanisms 108.

The base 102 has a plurality of arcuate lateral wafer support segments 110, which extend from a planar portion 114 of the base and define the wafer stack pocket 112. A floor 116 is positioned at the bottom of the pocket 112. The planar portion 114 constitutes a seat and bearing surface for the top cover edge. A side wall 120 extends around the periphery 170 of the base. Nominal wall structures 122 in the pocket floor 116 provide structural rigidity to the base 102.

The planar surface 114, which constitutes a bearing surface for the top cover edge, extends around the lateral wafer support segments 110. Extending upwardly from the planar surface 114 is a protruding structure configured as a shoulder 128. The shoulder 128 includes an upright surface 130, which operates as an outer constraint to the top cover 104, primarily during impact or other stressing.

Extending from two of the four corners of the base 102 are latching members 132. Latching members 132 include a hook portion 134 with a cam surface 136 and an engagement surface 138. The cam surface 136 deflects the latching member 132 when the top cover 104 is lowered into the latching position and snaps into place with the surface 138 engaged with top surface of the top cover 104. Significantly, the latching arm 132 has a horizontal extending section 142 and a curved portion 144 extending into an elongated upright portion 146. The horizontal portion 142 reduces the spring constant of the latching member 132 in the vertical direction by allowing up and down flex of said member 132. This compares to conventional wafer carriers with latches that do not include said horizontal member that have a spring constant in the vertical direction that equates to the spring constant of the material and any flex in the base where it is attached. This horizontal portion effectively extends the positions where the top cover 102 may be fixed in position. Moreover, it softens the downward pull of the top cover toward the base, which allows greater shock absorption during impact, such as dropping of the shipper. Said shock absorption can prevent further damage to the wafers and prevent damage to the shipper that would otherwise occur.

Referring to FIGS. 5, and 8–12, top cover 104 is depicted. The significant features include a nominal wall 140 that comprises the vast majority of said top cover, including various stiffening structure 174. The nominal wall may be configured to provide a pocket 176 for a 3½ inch diskette or a CD case. The top cover has a periphery 177 that includes an upwardly-extending lip 178 that follows the periphery. Said lip 178 adds to the structural rigidity and provides a stacking means.

Four planar sidewalls 175 extend downwardly from the upper lip 178 and, along with inset corner portions 173, define a wafer enclosure. The wafer enclosure perimeter 179 is generally square in shape. At each corner 173 is a flange portion 171 with apertures 148 to receive the latch member 132. Top cover 104, in conjunction with the sidewalls 175, provide a top cover 104 that is highly rigid, even when formed with such soft plastics as polypropylene.

Figure 8:
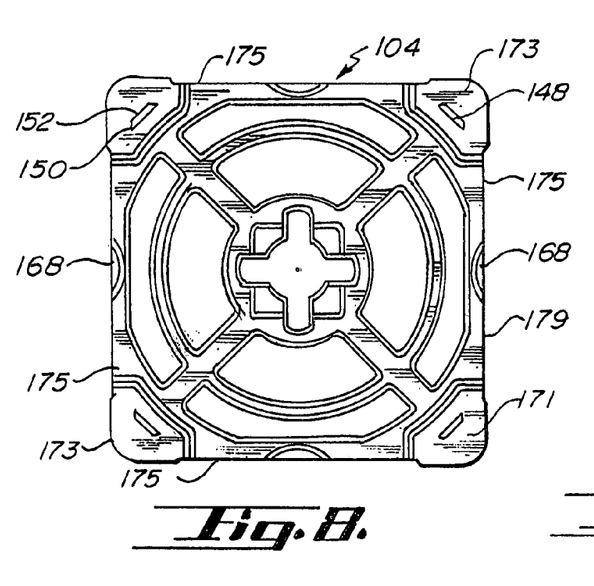
FIG. 8 is a plan view of the inside of the top of a cover for a shipper according to an embodiment of the present invention.
Figure 9:
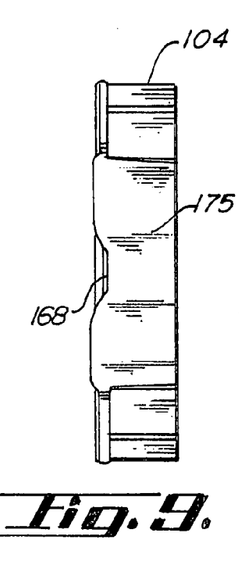
FIG. 9 is a side view of a cover for a shipper according to an embodiment of the present invention.
Figure 10:
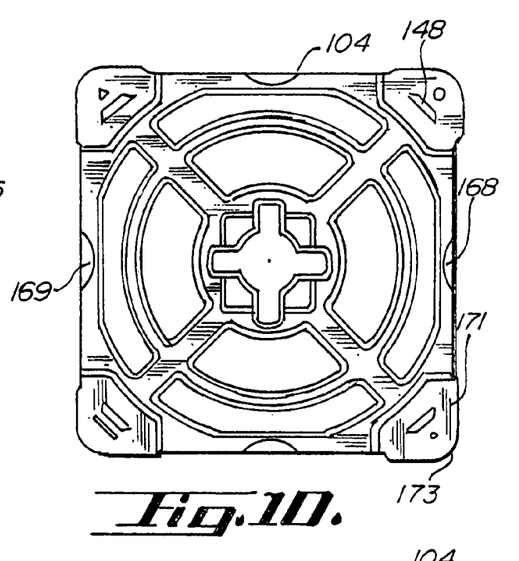
FIG. 10 is a plan view of the outside top of a cover for a shipper according to an embodiment of the present invention.
Figure 11:
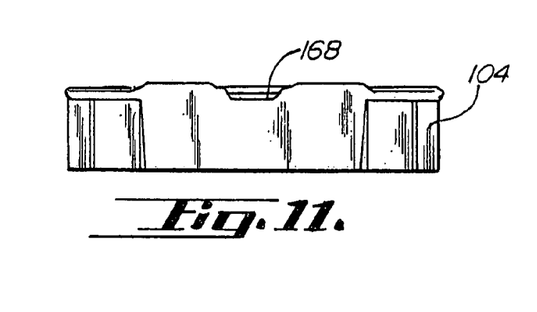
FIG. 11 is a side view of a cover for a shipper according to an embodiment of the present invention.
Figure 12:
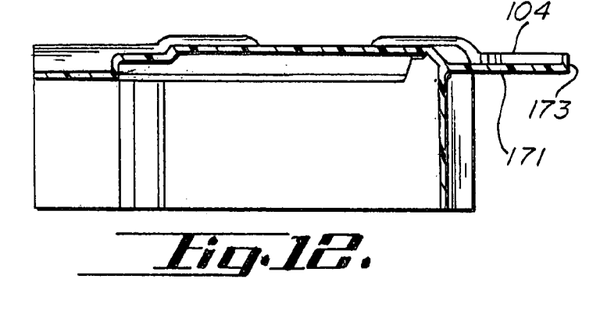
FIG. 12 is a perspective edge view of a cover for a shipper according to an embodiment of the present invention.
Figures 13, 14, 15, 16, 17:
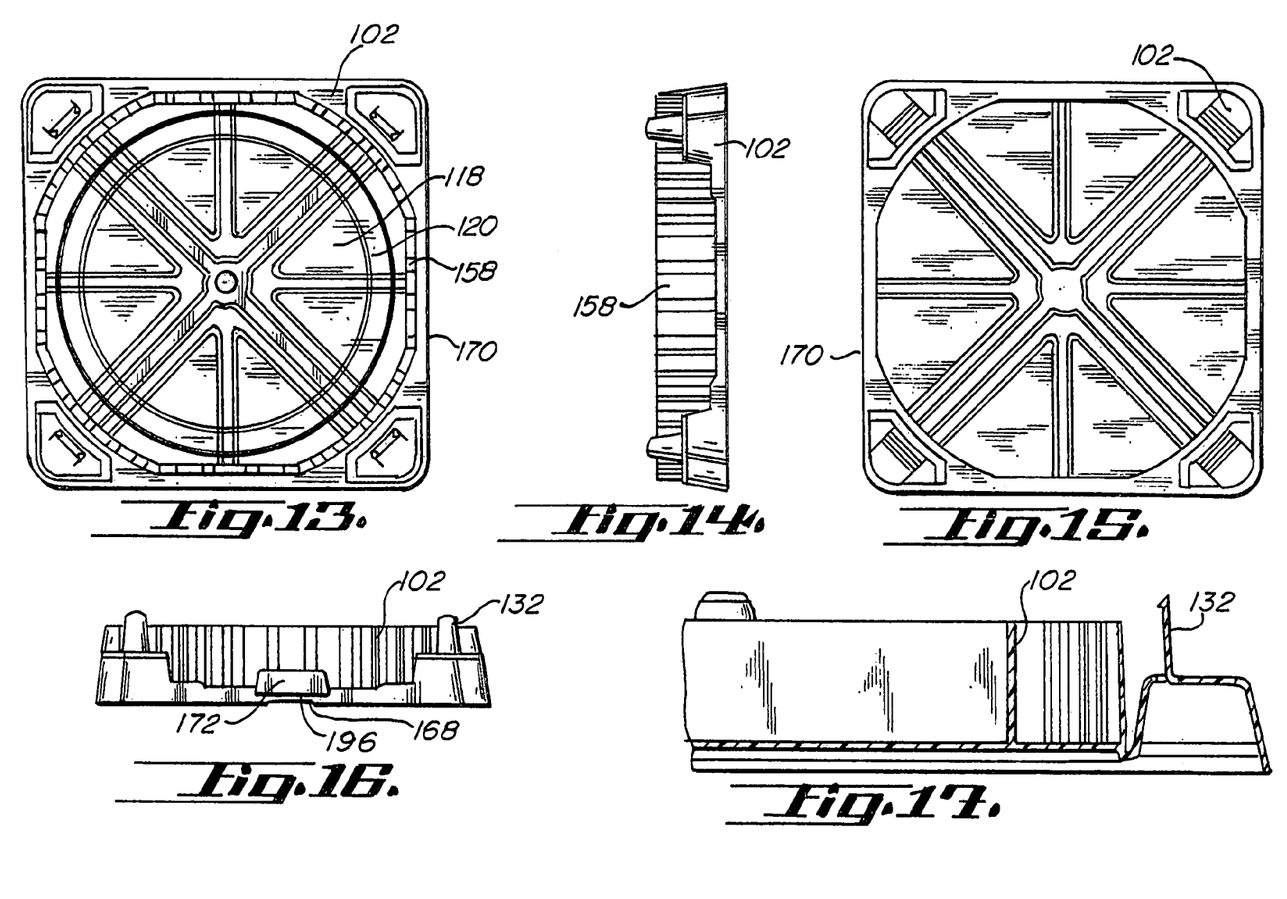
FIG. 13 is a top plan view of a base for a shipper according to an embodiment of the present invention.
FIG. 14 is a side view of a base for a shipper according to an embodiment of the present invention.
FIG. 15 is a bottom view of a base for a shipper according to an embodiment of the present invention.
FIG. 16 is a side view of a base for a shipper according to an embodiment of the present invention.
FIG. 17 is a perspective edge view of a base for a shipper according to an embodiment of the present invention.

The latching apertures 148 in cover 104 are formed in an approximate T-shape. This shape comprises a first width or head 150 and a second narrower width or neck 152. The neck 152 is slightly greater in width than the width of the latching member 132 where it extends through the neck. The head 150 has a width greater than the neck 152. The latching member 132 engages the head 150 of the aperture 148 and is moved into the neck region 152 due to the movement of cam surface 136 along the underside of the cover 104 corner portion 173 during the latching process.

Figures 23, 24:
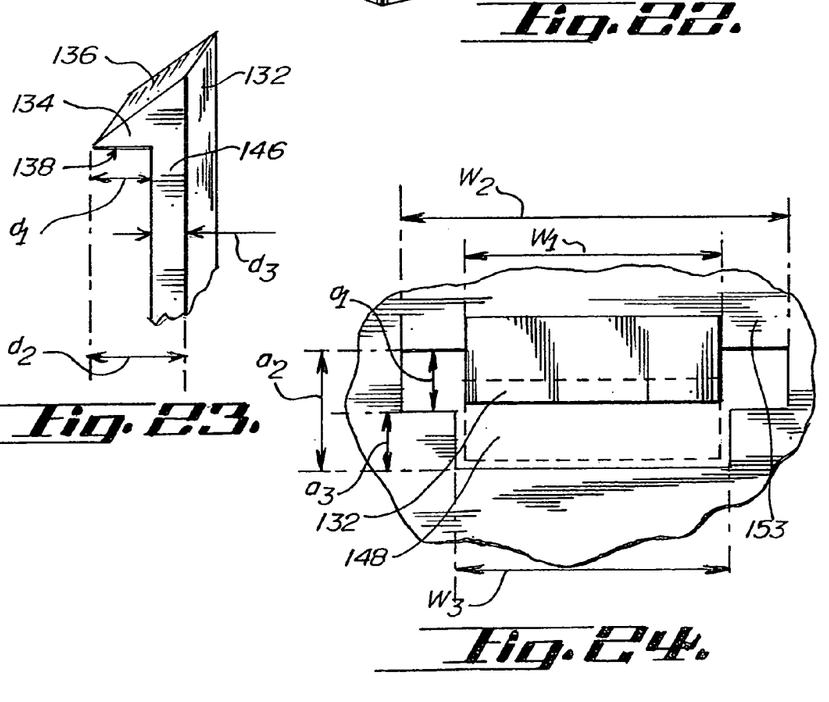
FIG. 23 is a perspective view of the latching member of the base according to an embodiment of the present invention.
FIG. 24 is a diagram of the latching member engaging the latching aperture according to an embodiment of the present invention.

Referring to FIGS. 23 and 24, the movement of latching member 132 within the latching aperture 148 is illustrated. The latching aperture has a depth dimensions $d_1$, $d_2$ and $d_3$ as shown. Dimension $d_2$ is equal to $d_1$ plus $d_3$. Dimension $d_3$ is the depth of the engagement surface 138. Dimension $d_1$ is the depth of the upright portion 146 of the latching member 132. The latching member also defines a width dimension $w_1$. It should be appreciated that the dimensions of portions of the latching member may vary when measured at different points, due to tapering or irregular shape. Therefore, the dimensions will be described with reference to a maximum value taken at horizontal plane taken at the height of the engagement surface 138.

The latching aperture 148 defines a head 150 having a depth dimension $a_1$ and a neck 152 having a depth dimension $a_3$. Dimension $a_2$ is the sum of $a_1$ plus $a_3$. The head defines a width $w_2$ and the neck 152 defines a width $w_3$. Again, these dimensions are defined as maximum values. Dimension $w_2$ is greater than $w_3$ and $w_3$ is greater than $w_1$ ($w_2>w_3>w_1$). Moreover, $a_2$ is greater than $d_2$, which is greater than a1 ($a_2>d_2>a_1$). Dimension $d_3$ is also less than $a_1$ ($d_3<a_1$) and $d_2$ is greater than $d_3$ ($d_2>d_3$).

Figure 18:
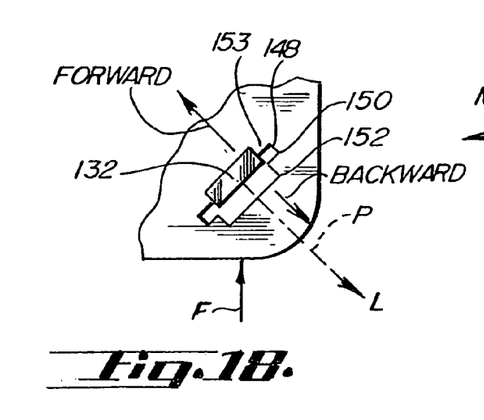
FIG. 18 is a diagram of a latching mechanism before introduction of an impact force.
Figure 19:
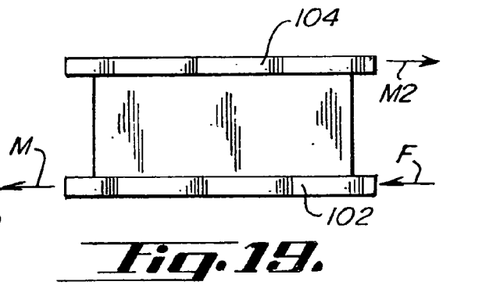
FIG. 19 is a diagram of a shipper in shearing movement.
Figure 20:
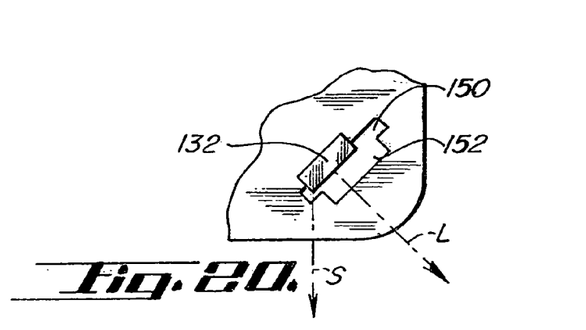
FIG. 20 is a diagram of the latching mechanism of FIG. 43 after the shear movement.

Referring to FIGS. 18, 19 and 20, an advantage of the approximately T-shaped aperture 148 is illustrated. FIG. 18 shows the latching member 132 in the engaged or latched position. Latching member 132 must receive a purely perpendicular force L to urge said member 132 into the neck region 152 to complete the unlatching process. A force with any non-perpendicular component, such as that received due to a drop or other strike, will not unlatch the cover 104.

In FIG. 18, force F is introduced to the shipper. Force F has both a lateral component and a perpendicular component with respect to member 132. FIG. 19 illustrates how force F causes base 102 to shear in direction M1 with respect to cover 104, which moves relatively in direction M2. Such relative movements of the cover 104 and base 102 cause latching member 132 to move in direction S, as shown in FIG. 18. By moving to the position shown in FIG. 20, the member 132 cannot move in perpendicular direction L so as to unlatch the shipper 100. By preventing the shipper 100 from unintentionally unlatching, the protection of the shipper contents is enhanced.

A further feature of particular embodiments of the invention is shown in the differences between FIG. 5 and FIG. 6. The shipper 100 may be configured to contain either film frames as shown in FIG. 5, or semiconductor wafers as shown in FIG. 6, or a combination thereof. In wafer shipping configuration, the base 102 of shipper 100 is provided with a wafer support wall 120 that defines an inner pocket 154 and an outer region 156. The support wall 120 in the preferred embodiment is a continuous ring having a diameter only slightly greater than the diameter of the wafers carried therein.

In film frame configuration, the base of shipper 100 is provided with a frame support wall 158 that defines an inner frame pocket 160 and outside region 162. The frame support wall 158 preferably forms an undulating surface that alternates between forming an inner circumference 164 and outer circumference 166, as shown in FIGS. 5 and 6. Other configurations of frame support walls may be used without departing from the scope of the present invention.

Figures 7A, 7B, 7C, 7D, 7E, 7F, 7G:
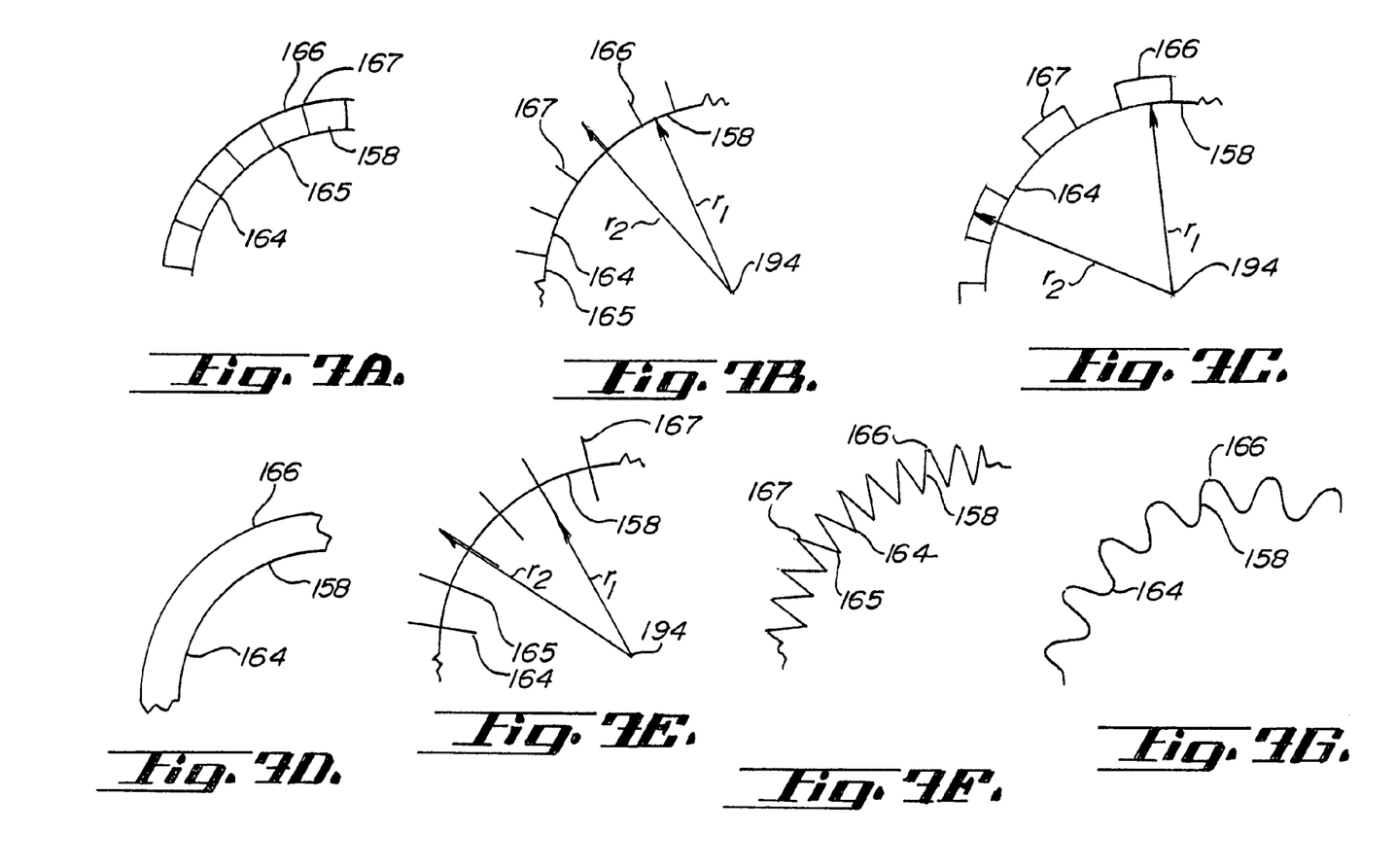
FIG. 7A is a partial plan view of the film frame support wall according to an embodiment of the present invention.
FIG. 7B is a partial plan view of the film frame support wall according to an embodiment of the present invention.
FIG. 7C is a partial plan view of the film frame support wall according to an embodiment of the present invention.
FIG. 7D is a partial plan view of the film frame support wall according to an embodiment of the present invention.
FIG. 7E is a partial plan view of the film frame support wall according to an embodiment of the present invention.
FIG. 7F is a partial plan view of the film frame support wall according to an embodiment of the present invention.
FIG. 7G is a partial plan view of the film frame support wall according to an embodiment of the present invention.

FIGS. 7A–7G show some of the potential alternative wall 160 configurations contemplated by the present invention. As illustrated in FIGS. 7B, 7C and 7E, the support wall 158 comprises an inner perimeter 165 and outer perimeter 167. Inner perimeter 165 has a radius $r_1$ from a center point 194 of the base 102. Outer perimeter 167 has a radius $r_2$ from the center point 194. Dimension $r_2$ is greater than $r_1$. The radius dimensions $r_2$ and $r_1$ are varied in a repeating pattern to define the respective outer 165 and inner 167 perimeters.

A further feature of particular embodiments of the present invention is shown in FIGS. 8–17 and 21. The cover 104 is provided with a plurality of recesses 168 about the perimeter 170. The recesses 168 are disposed preferably at the approximate midpoint of each side about the perimeter 170 of the cover 104. However, other configurations of greater or fewer recesses and at other positions are within the scope of the present invention. The base 102 may also be recessed, as shown in FIGS. 16–21, in addition to, or instead of, the recesses in the cover 104. The recesses 168 enable the carriers 100 to be more easily grasped by either humans or mechanical devices when vertically stacked with one or more respective shippers 100.

Figure 21:
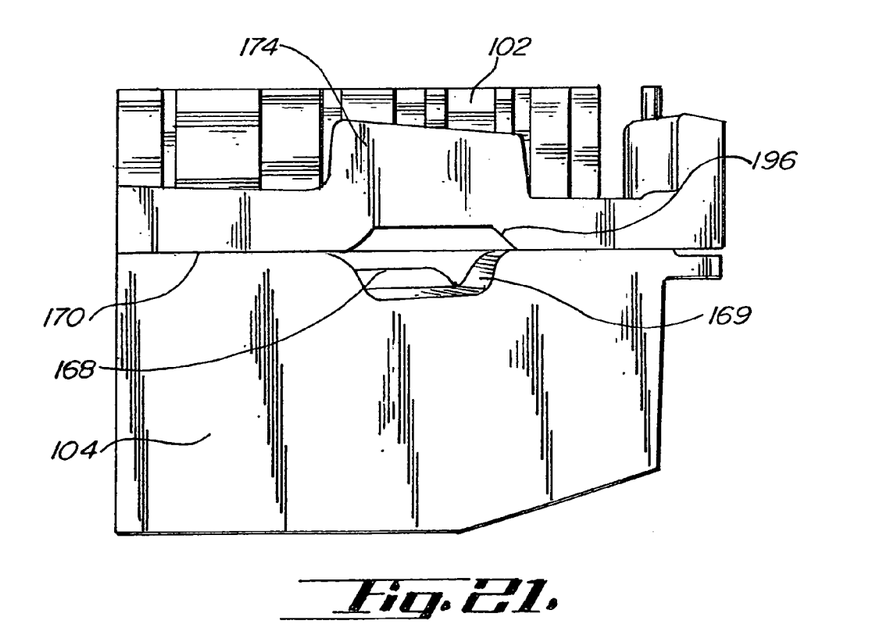
FIG. 21 is a perspective view of a recess according to an embodiment of the present invention.

The top surface of a first shipper is further configured to cooperate with the bottom surface of a second carrier so that the combination of stacked carriers resists shearing movement. FIG. 21 shows base 102 of a first carrier in alignment with a cover 102 of a second carrier. Clearance is created by a recess 168 between the bottom of base 102 of a first shipper and the top of cover 104 of a second shipper in stacked configuration. The recess 168 is formed by an aperture 169 formed in the cover 104 along the periphery thereof. The aperture extends inwardly of at least a portion of the perimeter 179 of the base 102. A second aperture 196 may also be formed in the perimeter of the base 102.

A further feature of particular embodiments of the present invention is shown in FIGS. 5, 6, 16 and 21. Tab 172 is provided on one or more sides of base 102. Tab 172 maybe used for mounting an identification and/or information means, such as a bar code label, on shipper 100. Additionally, the tab, when aligned with recess 168, serves as a guard for preventing forces from being introduced to the cover 104 of a shipper 100 when the base 102 of said shipper 100 is grasped at recess 168.

Figure 22:
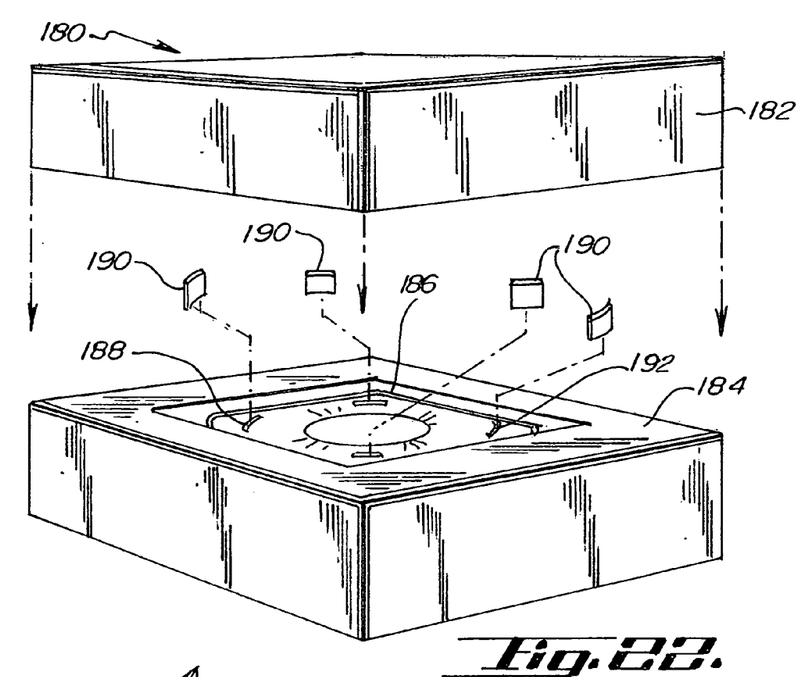
FIG. 22 is a perspective view of a convertible mold with inserts for converting the mold according to an embodiment of the present invention.

A further aspect of the present invention is the method for manufacturing a shipper wherein the mold is easily adapted to produce shippers for both wafers and film frames. Referring to FIG. 22, a mold 180 is shown with a lower portion 184 and an upper portion 182 that cooperate to form a mold cavity 186. Such a mold 180 is shown for molding the base portion having a mold cavity 186, including a first set of slots 192 or recesses, which are for forming the frame support wall, and a second set of slots 188 or recesses, which are for forming the wafer support wall. Plugs or blanks 190 sized to fill or cover the second set of slots 188 is utilized for converting from, for example, a wafer shipper to a film frame shipper. The methodology of accomplishing comprises insertion of the blanks into the slots and performing the molding operation.

Although the present invention has been described with reference to preferred embodiments, workers skilled in the art will recognize changes may be made in form and detail without departing from the spirit and scope of the invention.

What is claimed is:

1. A carrier for semiconductor wafers in combination with a stack of wafers, the carrier comprising:
    a base having a perimeter with at least one support wall extending upwardly inside the perimeter and defining a storage pocket containing the stack of wafers inside the at least one support wall, the base including a pair of resilient latching members positioned between the perimeter and the support wall, each latching member having an upright portion extending upwardly with a hook portion having a downwardly facing engagement surface,
    a cover having a periphery with at least one sidewall extending downwardly inside the periphery, the cover being disposable on the base to enclose the storage pocket, the cover including structure defining a pair of latching apertures each with a bearing surface for receiving the downwardly facing engagement surface adjacent to the latching aperture, each latching aperture positioned between the periphery and the at least one sidewall and corresponding to the pair of latching members, whereby when the pair of latching members is engaged with the top cover at the pair of apertures the cover is latched onto the base,
    and wherein the latching aperture has a first region adjacent the bearing surface and a second region opposite the bearing surface with a restricted opening between the first region and the second region, the first region sized to allow lateral movement of the latching member by bending of the latching member without the unlatching of the top cover, and the latching apertures and latching members sized such that each latching member must be deflected past the respective restricted opening into the respective second region to be disengaged from the respective bearing surface and to effect the unlatching of the top cover.

2. The combination of claim 1, wherein the latching aperture is generally T-shaped with the first region being the lower leg of the T.

3. The combination of claim 1, wherein the storage pocket is configured to retain film frames, with wafers adhered thereto, therein.

4. The combination of claim 1, wherein the storage pocket is configured to retain semiconductor wafers therein without film frames.

5. The combination of claim 1, wherein the at least one support wall comprises an outer perimeter and an inner perimeter, the inner perimeter and outer perimeter defined by a pattern of two distinct radii alternating in a repeating pattern.

6. The combination of claim 5, wherein the base further comprises one or more wafer support segments, the one or more wafer support segments defining an inner pocket.

7. The combination of claim 6, wherein the support wall has a saw-tooth configuration.

8. The combination of claim 1, wherein the cover further comprises one or more apertures defined in the periphery and extending inwardly of the perimeter of the base, the one or more apertures aiding in grasping of the carrier when stacked vertically upon an adjacent carrier.

9. The combination of claim 1, wherein the perimeter of the base comprises four sides, and wherein a tab is disposed at a midpoint of one or more of the four sides, the tabs for receiving identification information.

10. A shipper for semiconductor wafers or film frames, the shipper comprising:
    a base having a perimeter with at least one support wall extending upwardly inside the perimeter and defining a storage pocket inside the at least one support wall, the base including a pair of resilient latching members positioned between the perimeter and the support wall and having an upright portion extending upwardly with a hook portion having an engagement surface, the at least one support wall comprising an outer perimeter and an inner perimeter, the inner perimeter and outer perimeter defined by a pattern of two distinct radii alternating in a repeating pattern; and
    a cover having a periphery with at least one sidewall extending downwardly inside the periphery, the cover being disposable on the base to enclose the storage pocket, the cover including structure defining at least one latching aperture positioned between the periphery and the at least one sidewall and corresponding to one of the pair of resilient latching members.

11. The shipper of claim of claim 10, wherein, the cover further comprises a latching aperture, the latching aperture defining a first engagement width and a second engagement width, the first engagement width being larger than the second engagement width.

12. The shipper of claim 10, wherein the at least one support wall has a saw-tooth configuration.

13. A combination of a carrier for semiconductor wafers and a stack of wafers, the carrier comprising:
    a base having a perimeter with at least one support wall extending upwardly inside the perimeter and defining a storage pocket with the stack of wafers inside the at least one support wall, the base including at least one resilient latching member positioned between the perimeter and the support wall and having an upright portion extending upwardly with a hook portion having an engagement surface; and
    a cover having a periphery with at least one sidewall extending downwardly inside the periphery, the cover being disposable on the base to enclose the storage pocket, the cover including structure defining at least one T-shaped latching aperture positioned between the periphery and the at least one sidewall and corresponding to the at least one latching members, the latching member deflectable to be released from the T-shaped aperture thereby unlatching the cover.

14. The combination of claim 13, wherein the at least one latching member has a depth dimension $d_1$, a depth dimension $d_2$, a depth dimension $d_3$ and a width dimension $W_1$, wherein the dimension $d_2$ is equal to dimension $d_1$ plus dimension $d_3$, and the at least one aperture has a width dimension $w_2$, a width dimension $w_3$, a depth dimension $a_1$, a depth dimension $a_2$ and a depth dimension $a_3$, wherein the dimension $w_2$ is greater than dimension $w_3$, wherein dimension $w_3$ is greater than dimension $w_1$, wherein dimension $a_2$ is greater than dimension $d_2$, wherein dimension $d_2$ is greater than dimension $a_1$, and wherein dimension $d_3$ is less than dimension $a_1$.

* * * * *

UNITED STATES PATENT AND TRADEMARK OFFICE
CERTIFICATE OF CORRECTION

PATENT NO. : 7,040,487 B2  
APPLICATION NO. : 10/194438  
DATED : May 9, 2006  
INVENTOR(S) : Michael Zabka and James Nigg It is certified that error appears in the above-identified patent and that said Letters Patent is hereby corrected as shown below:

Col. 9, line 64, delete "carner" and insert --corner--

Col. 10, line 53, delete "W" and insert --w--

Signed and Sealed this

Sixth Day of March, 2007

JON W. DUDAS  
*Director of the United States Patent and Trademark Office*